(12) United States Patent
Humpston (10) Patent No.: US 8,545,599 B2
(45) Date of Patent: Oct. 1, 2013

(54) ELECTROHYDRODYNAMIC DEVICE COMPONENTS EMPLOYING SOLID SOLUTIONS

(75) Inventor: Giles Humpston, Buckinghamshire (GB)

(73) Assignee: Tessera, Inc., San Jose, CA (US)

( * ) Notice: Subject to any disclaimer, the term of this patent is extended or adjusted under 35 U.S.C. 154(b) by 391 days.

(21) Appl. No.: 12/914,786

(22) Filed: Oct. 28, 2010

(65) Prior Publication Data

US 2012/0103196 A1    May 3, 2012

(51) Int. Cl.
*B03C 3/40* (2006.01)

(52) U.S. Cl.
USPC ........... 95/59; 55/385.6; 95/73; 96/69; 96/74; 96/95; 96/98; 313/311; 313/352; 313/354; 313/355

(58) Field of Classification Search
USPC ............. 95/59, 73, 78; 96/63, 69, 74, 95–99; 55/385.6, DIG. 5; 313/311, 352–355
See application file for complete search history.

(56) References Cited

U.S. PATENT DOCUMENTS

| | | | | |
|---|---|---|---|---|
| 4,086,650 A | * | 4/1978 | Davis et al. | ................... 361/229 |
| 4,227,234 A | | 10/1980 | Seanor | |
| 4,585,320 A | | 4/1986 | Altavela | |
| 4,839,517 A | | 6/1989 | Dinter | |
| 5,466,279 A | * | 11/1995 | Hattori et al. | ..................... 96/69 |
| 6,057,638 A | * | 5/2000 | Cathey et al. | ................. 313/311 |
| 6,290,823 B1 | | 9/2001 | Hyllberg | |
| 7,258,590 B2 | * | 8/2007 | Oyama et al. | .................... 445/50 |
| 2003/0102793 A1 | * | 6/2003 | Komoda et al. | ................ 313/311 |
| 2003/0111946 A1 | * | 6/2003 | Talin et al. | .................... 313/311 |
| 2006/0018812 A1 | * | 1/2006 | Taylor et al. | ............. 422/186.04 |

FOREIGN PATENT DOCUMENTS

| | | | |
|---|---|---|---|
| GB | 2090547 A | | 7/1982 |
| JP | 6-165949 A | * | 6/1994 ....................... 96/97 |
| JP | 2002058731 A | | 2/2002 |

* cited by examiner

*Primary Examiner* — Richard L Chiesa (57) ABSTRACT

A thermal management apparatus includes an electrohydrodynamic fluid accelerator in which an emitter electrode and another electrode are energizable to motivate fluid flow. One of the electrodes includes a solid solution formed of a solvent metal having a first performance characteristic and a solute material having a second performance characteristic. The first and second performance characteristics are exhibited substantially independently in the electrode as the solvent metal and solute material remain substantially pure within the solid solution. A method of making an EHD product includes providing an electrode with such a solid solution and positioning the electrode relative to another electrode to motivate fluid flow when energized.

27 Claims, 6 Drawing Sheets

ELECTROHYDRODYNAMIC DEVICE COMPONENTS EMPLOYING SOLID SOLUTIONS

BACKGROUND

1. Field of the Invention

This application relates generally to electrodes in electrohydrodynamic or electrostatic devices such as electrohydrodynamic fluid accelerators and electrostatic precipitators, and particularly to classes of materials that can be used to form such electrodes.

2. Description of the Related Art

Many electronic devices and mechanically operated devices require air flow to help cool certain operating systems by convection. Cooling helps prevent device overheating and improves long term reliability. It is known to provide cooling air flow with the use of fans or other similar moving mechanical devices; however, such devices generally have limited operating lifetimes, produce noise or vibration, consume power or suffer from other design problems.

The use of an ion flow air mover device, such as an electrohydrodynamic (EHD) device or electro-fluid dynamic (EFD) device, may result in improved cooling efficiency, reduced vibrations, power consumption, electronic device temperatures, and noise generation. This may reduce overall device lifetime costs, device size or volume, and may improve electronic device performance or user experience.

Devices built using the principle of the ionic movement of a fluid are variously referred to in the literature as ionic wind machines, electric wind machines, corona wind pumps, electro-fluid-dynamics (EFD) devices, electrohydrodynamic (EHD) thrusters and EHD gas pumps. Some aspects of the technology have also been exploited in devices referred to as electrostatic air cleaners or electrostatic precipitators.

In general, EHD technology uses ion flow principles to move fluids (e.g., air molecules). Basic principles of EHD fluid flow are reasonably well understood by persons of skill in the art. Accordingly, a brief illustration of ion flow using corona discharge principles in a simple two electrode system sets the stage for the more detailed description that follows.

Figure 1:
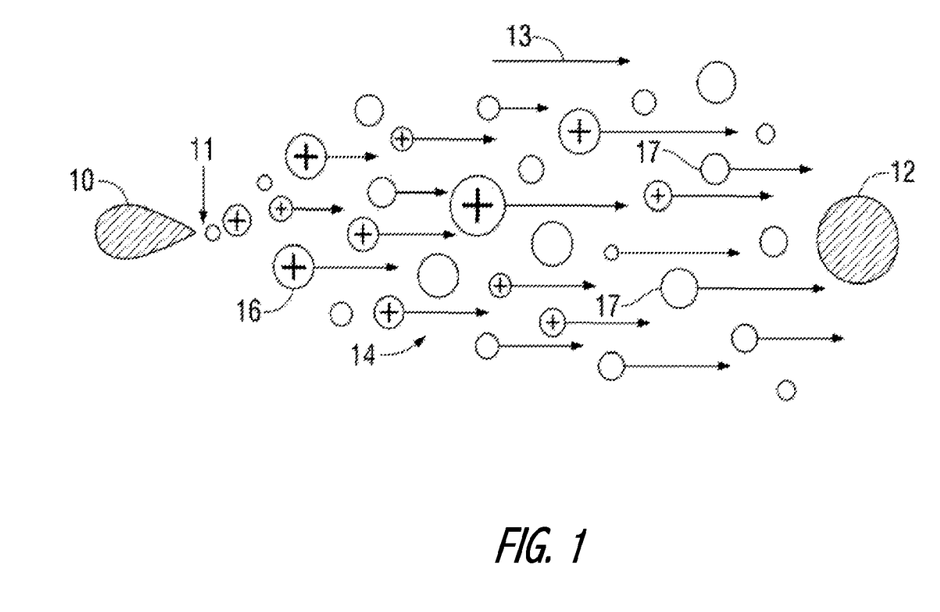
FIG. 1 is a depiction of certain basic principles of electrohydrodynamic (EHD) fluid flow.

With reference to the illustration in FIG. 1, EHD principles include applying a high intensity electric field between a first electrode 10 (often termed the "corona electrode," the "corona discharge electrode," the "emitter electrode" or just the "emitter") and a second electrode 12. Fluid molecules, such as surrounding air molecules, near the emitter discharge region 11 become ionized and form a stream 14 of ions 16 that accelerate toward second electrode 12, colliding with neutral fluid molecules 22. During these collisions, momentum is imparted from the stream 14 of ions 16 to the neutral fluid molecules 22, inducing a corresponding movement of fluid molecules 22 in a desired fluid flow direction, denoted by arrow 13, toward second electrode 12. Second electrode 12 may be variously referred to as the "accelerating," "attracting," "target" or "collector" electrode. While stream 14 of ions 16 is attracted to, and generally neutralized by, second electrode 12, neutral fluid molecules 22 continue past second electrode 12 at a certain velocity. The movement of fluid produced by EHD principles has been variously referred to as "electric," "corona" or "ionic" wind and has been defined as the movement of gas induced by the movement of ions from the vicinity of a high voltage discharge electrode 10.

Ozone ($O_3$), while naturally occurring, can also be produced during operation of various electronics devices, including EHD devices, photocopiers, laser printers and electrostatic air cleaners, and by certain kinds of electric motors and generators, etc. Elevated ozone levels have been associated with respiratory irritation and certain health issues. Therefore, ozone emission can be subject to regulatory limits such as those set by the Underwriters Laboratories (UL) or the Environmental Protection Agency (EPA). Accordingly, techniques to reduce ozone concentrations have been developed and deployed to catalytically or reactively break down ozone ($O_3$) into the more stable diatomic molecular form ($O_2$) of oxygen.

Some of the characteristics in which known emitter and collector materials are often deficient entail surface chemistry and catalysis. For example, EHD device performance reduction or failure can be caused by gradual coating of the emitter with silica. Still other EHD devices produce unacceptable concentrations of ozone in the air transported through the device. Additionally, some electrodes may be susceptible to oxidation, corona erosion, or accumulation of detrimental materials. The term "corona erosion" refers to various adverse effects from a plasma discharge environment including enhanced oxidation, and etching or sputter of emitter surfaces. In general, corona erosion can result from any plasma or ion discharge including, silent discharge, AC discharge, dielectric barrier discharge ("DBD") or the like.

Generally, many desirable electrode materials properties can be achieved by forming the emitter and collector being made of particular metals. For example, the emitter may be made of tungsten and the collector made of aluminum to provide desired conductivity, hardness and strength. However, pure metals are often deficient in some regard with respect to other desirable materials characteristics. One proposed solution is to use an alloy in place of a pure metal. While various metals or alloys may be selected to address a particular one of these performance parameters, a combination of two materials having known performance characteristics often yields an alloy or compound exhibiting significantly different characteristics.

For example, a collector may be made of an aluminum alloy to increase its hardness. Similarly, the emitter electrode may be made of stainless steel, so that the three elements of iron, nickel and chromium are present and exposed to the atmosphere in which the EHD device operates. While each of the elements present in the alloy will contribute in some way to the overall characteristics required, alloys of such metals do not always provide the same desirable characteristics as the pure metals would alone and such compound characteristics are not always readily predictable.

Many metal alloys exhibit duplex or higher ordered microstructures. For example, mixing of lead with tin results not in a mixture of pure lead and tin, but a two-phase mixture consisting of lead containing tin and tin containing lead. The alloy no longer contains either pure lead or pure tin so the beneficial effects of these elements may be altered, diminished or lost. While some phases formed on alloying may present other beneficial materials characteristics, such beneficial properties are not readily determinable or predictable without extensive testing as the new phases do not present the same properties as the pure components.

Accordingly, improvements are sought in enhancing electrode performance by providing predictable combined performance characteristics through combination of selected materials.

SUMMARY

It has been discovered that alloys comprising solid-solutions may be employed in emitter and collector electrodes or other electrodes or components of EHD devices to provide a range of combined, yet substantially independent desirable materials characteristics. The solid solution includes a solvent metal and one or more solute material(s). The solute materials can include metals, semi-metals, non-metals and compounds. The solute material forms an interstitial or substitutional solid solution in the solvent metal.

Thus, electrohydrodynamic ("EHD") device emitter and collector electrodes may be made of solid solution alloys exhibiting substantially independent material properties corresponding to the various selected components of the solid solution alloy. To provide desirable combinations of characteristics in varied applications, these components may be further formed of multiple materials selected to exhibit a combination of materials performance characteristics.

Advantageous emitter and collector electrode characteristics can include, e.g.:
1—Electrical conductivity
2—Resistance to erosion by corona
3—Resistance to oxidation
4—Non-stick/low adhesion surface for silica and dust
5—Low ozone generation or catalytic activity towards ozone
6—Low coefficient of friction
7—Moderate hardness and tensile strength
8—Resistance to high temperature
9—Resistance to thermal cycling It has been discovered that by maintaining the alloy components in substantially pure form, at least at the atomic level, the performance characteristics of the alloy may be determined by the independent performance characteristics of the solvent metal and solute material.

For example, in some implementations, an alloy of nickel is infused with carbon (e.g., at 1 atomic weight percent) resulting in carbon atoms in solid solution in a matrix of nickel atoms. Thus, both nickel and carbon are present at the surface of the alloy and each contributes respective independent properties and characteristics to the combined material performance characteristics. In contrast, cementite or $Fe_3C$, which is a conventional intermetallic compound, exhibits very different properties from iron and carbon separately.

In some implementations, an emitter electrode material comprises palladium solvent metal and a silver solute material. Palladium exhibits many desirable characteristics such as high strength and conductivity, while silver is an excellent catalyst for ozone. In the solid solution, some palladium atoms are displaced by silver at the surface of the electrode, and, in some cases through at least a substantial portion of the bulk of the electrode. Thus, the materials characteristics of the electrode are substantially similar to those of pure palladium, with the addition of an ozone reducing catalytic effect provided by sufficient concentration of silver atoms at the electrode surface.

In some implementations, titanium or tantalum serves as the solvent metal. Both of these metals exhibit high strength and conductance, yet typically oxidize in the type of plasma environment commonly found in an EHD device. Gold, however, resists tarnishing and oxidation and is soluble in both titanium and tantalum. A gold-enriched solid solution electrode surface is thus more resistant to oxidation than either of the pure solvent metals, improving at least that characteristic without significantly impacting other desirable solvent metal properties like tensile strength or electrical conductivity.

In some implementations, the longevity of an EHD device may be improved if dust or other detrimental materials do not accumulate on the emitter and collector electrode surfaces. Different pure metals suitable for use as emitter or collector electrodes generally exhibit similar relatively high friction coefficients. However, non-metal materials such as carbon graphite are known to have relatively low friction coefficients. Advantageously, some metals, notably palladium, can absorb nearly up to about 2 wt % carbon in interstitial solid solution. An interstitial solid solution of graphite in palladium provides the characteristics of palladium, with the additional low friction coefficient characteristic of graphite. Thus, a solid solution including graphite can provide a low coefficient of friction and/or low surface adhesion to an electrode surface.

In an interstitial solid solution, the solute material atoms fit inside the empty volume or "interstices" of the solvent metal matrix. In a substitutional solid solution, the solute material atoms displace some of the solvent metal atoms in the solvent metal matrix.

In some implementations, one or more compounds or alloys may serve as the solute material in solid solution with the solvent metal. For example, a solid solution can include molybdenum as the solvent metal modified by the addition of a nickel molybdenum compound as the solute material. In this instance, the materials characteristics are those of molybdenum and the compound MoNi.

In some implementations, a single solvent metal may accommodate more than one solute material, each added to confer different, substantially independent characteristics. For example, a palladium solvent metal may receive both silver and manganese independently as solute materials.

In some implementations, one aspect of the invention includes an electrode for use in an electrohydrodynamic device. The elongated electrode body includes an electrode solvent metal selected to exhibit first performance characteristics including electrical conductivity and at least moderate hardness and tensile strength such that the electrode can be tensioned and energized with a high voltage. At least one solute material forms a solid solution with the solvent metal substantially without forming intermetallic compounds with the solvent metal. The solute material is selected to exhibit second performance characteristics substantially independent of the first performance characteristics of the solvent metal.

In some implementations, the electrode solvent metal includes at least one of tungsten, titanium, tantalum, palladium, molybdenum, titanium, copper and iron.

In some implementations, the at least one solute material includes one of a metal, semi-metal, non-metal and a compound. The at least one solute material can include at least one of silver, nickel, gold, carbon, hydrogen, silicon, manganese and germanium. The at least one solute material can include at least one of titanium nitride, chromium carbide and silica.

In some implementations, a second solute material can be in solid solution in the electrode solvent metal.

In some implementations, a crystal structure of the solvent metal remains substantially unchanged by addition of the solute material and wherein the solid solution comprises a substantially homogeneous phase.

In some implementations, the second performance characteristics include ozone reduction. In some cases, the at least one solute material includes an ozone reducing catalyst.

In some implementations, the second performance characteristics include at least one of low surface adhesion, low coefficient of friction, resistance to oxidation, resistance to high temperature, resistance to thermal cycling and resistance to corona erosion.

In some implementations, the solid solution is one of a substitutional solid solution and an interstitial solid solution.

In some implementations, the solid solution is a homogenous phase of substantially consistent composition throughout a thickness of the electrode.

In some implementations, the at least one solute material is concentrated substantially on an exterior surface of the electrode.

In some implementations, the electrode includes an electrode core about which the solid solution is formed.

In some implementations, the at least one solute material forms a solid solution layer on the surface of the electrode core formed of the solvent metal.

In some implementations, the solid solution is one of electroplated, sputter deposited and vapor deposited onto the electrode core.

In some implementations, the solid solution forms a substantially uniform coating over the electrode core.

In some implementations, the solute material is selected to reduce ozone. In some cases, the first solute material is an ozone reducing material, e.g., catalyst, selected from a group that includes: manganese dioxide ($MnO_2$); silver (Ag); silver oxide ($Ag_2O$); and an oxide of copper (CuO).

In some implementations, one aspect of the invention features an electrohydrodynamic device including an emitter electrode one or more collector electrodes in spaced relation to the emitter electrode; the emitter and one or more collector electrodes being energizable to motivate fluid flow along a flow path. At least one of the collector and emitter electrodes includes an elongated electrode body including an electrode solvent metal selected to exhibit electrical conductivity and at least moderate hardness and tensile strength and at least one solute material forming a solid solution with the solvent metal substantially without forming intermetallic compounds with the solvent metal, the solute material selected to exhibit one or more of ozone reactivity, resistance to oxidation, resistance to corona erosion, low coefficient of friction, and low surface adhesion.

In some implementations, one aspect of the invention features an apparatus including an enclosure and a thermal management assembly for use in convection cooling of one or more devices within the enclosure. The thermal management assembly defines a flow path for conveyance of air between portions of the enclosure over heat transfer surfaces positioned along the flow path to dissipate heat generated by the one or more devices, the thermal management assembly including an electrohydrodynamic (EHD) fluid accelerator. The EHD fluid accelerator includes collector and emitter electrodes in spaced relation and energizable to motivate fluid flow along the flow path and at least one of the collector and emitter electrodes includes an elongated electrode body including an electrode solvent metal selected to exhibit electrical conductivity and at least moderate hardness and tensile strength and at least one solute material forming a solid solution with the solvent metal substantially without forming intermetallic compounds with the solvent metal, the solute material selected to exhibit one or more of ozone reactivity, resistance to oxidation, resistance to corona erosion, low coefficient of friction, and low surface adhesion.

In some implementations, the one or more devices includes one of a computing device, projector, copy machine, fax machine, printer, radio, audio or video recording device, audio or video playback device, communications device, charging device, power inverter, light source, medical device, home appliance, power tool, toy, game console, television, and video display device.

In some implementations, an electrohydrodynamic fluid accelerator includes an emitter electrode and/or at least one collector electrode including a solid solution and energizable to generate ions and to thereby motivate fluid flow along a flow path. The collector electrode is coupled into a heat transfer pathway to dissipate heat into the fluid flow. The emitter and/or collector electrodes exhibit performance characteristics of both the solvent metal and solute material(s) of the solid solution.

In some applications, a method of making a product includes providing an electrode core and selecting a solvent metal and solute material to form a solid solution on the electrode core material. The solvent metal and solute material are selected to provide respective first and second performance characteristics.

In some applications, forming the solid solution component includes one of dip coating, spray coating or electroplating, anodizing or alodizing an underlying structure with the solid solution. In some cases, heat treatment of separate solvent and solute materials deposited by any of the above methods can be used to form the solid solution.

In some applications, one aspect of the invention includes a method of forming an electrode for use in an electrohydrodynamic device. The method includes providing an elongated electrode core selected to provide sufficient electrode dimensional stability and electrical conductivity for the electrode to be tensioned and energized with a high voltage. The method further includes providing on the electrode core a solvent metal selected to exhibit first performance characteristics including electrical conductivity and at least moderate hardness and providing at least one solute material forming a solid solution with the solvent metal substantially without forming intermetallic compounds with the solvent metal, the solute material selected to exhibit second performance characteristics substantially independent of the first performance characteristics of the solvent metal.

In some applications, providing the solvent metal and solute material on the electrode core includes coating the solid solution onto the electrode core.

In some applications, the method includes heat treating the solute material and solvent metal to induce formation of the solid solution.

In some applications, at least one of the solvent metal and the solute metal is provided on the electrode core via at least one of electroplating, vapor deposition, and sputter deposition.

In some applications, the solvent metal includes an outward portion of the electrode core such that the solid solution is formed at least at the surface of the electrode core.

In some applications, the solid solution extends substantially throughout the electrode core.

In some applications, the method further includes providing a second solute material in solid solution in the solvent metal to provide a third independent performance characteristic.

In some applications, the method further includes positioning heat transfer surfaces downstream of, and proximate to, the collector electrode; and fixing an emitter electrode proximate to the collector electrode that, when energized, generates ions and thereby motivates fluid flow over the heat transfer surfaces. The emitter electrode, collector electrode and heat transfer surfaces are so positioned and fixed to constitute a thermal management assembly.

In some applications, the method includes introducing the thermal management assembly into an electronic device and thermally coupling a heat dissipating device thereof to the heat transfer surfaces.

In the present application, some implementations of the devices illustrated and described herein are referred to as electrohydrodynamic fluid accelerator devices, also referred to as "EHD devices," "EHD fluid accelerators," and the like. Such devices are suitable for use as a component in a thermal management solution to dissipate heat generated by an electronic circuit amongst other things. For concreteness, some implementations are described relative to particular EHD device configurations in which a corona discharge at or proximate to an emitter electrode operates to generate ions that are accelerated in the presence of electrical fields, thereby motivating fluid flow. While corona discharge-type devices provide a useful descriptive context, it will be understood (based on the present description) that other ion generation techniques may also be employed. For example, in some implementations, techniques such as silent discharge, AC discharge, dielectric barrier discharge ("DBD") or the like may be used to generate ions that are in turn accelerated in the presence of electrical fields and to motivate fluid flow.

Based on the description herein, persons of ordinary skill in the art will appreciate that provision of solid solution materials on electrodes or other systems surfaces may likewise benefit systems that employ other ion generation techniques to motivate fluid flow. For example, a DBD system that provides electrical discharge between two electrodes separated by an insulating dielectric barrier may generate ozone, which may be mitigated using techniques described herein. Thus, in the claims that follow, the terms "emitter electrode" and "electrohydrodynamic fluid accelerator" are meant to encompass a broad range of devices without regard to the particular ion generation techniques employed.

In some cases, the emitter electrode and the collector electrode(s) together at least partially define an electrohydrodynamic fluid accelerator. For example, emitter electrode and the collector electrode(s) can be positioned relative to one another such that, when energized, ions are generated therebetween and fluid flow is thereby motivated along a fluid flow path.

In some implementations, the electrohydrodynamic fluid accelerator includes the emitter electrode and is energizable to motivate fluid flow along a fluid flow path, and the collector electrode surfaces are disposed upstream of the electrohydrodynamic fluid accelerator along the fluid flow path and are operable as part of an electrostatic precipitator.

In some implementations, an electrode including an exposed solid solution portion is energizable to contribute to flow of ion current in one of an electrohydrodynamic fluid accelerator and an electrostatic precipitator. In some implementations, both the emitter electrode and the collector electrode(s) are operable as part of an electrohydrodynamic fluid accelerator. Still, in some implementations, the emitter electrode and the collector electrode(s) are operable as part of an electrostatic precipitator. In some cases, at least one additional electrode surface is disposed either upstream or downstream of the electrohydrodynamic fluid accelerator or electrostatic precipitator along the fluid flow path.

In some implementations, the EHD device is part of a thermal management assembly for use in convective cooling of one or more devices within an enclosure. The thermal management assembly defines a flow path for conveyance of air between portions of the enclosure over heat transfer surfaces positioned along the flow path to dissipate heat generated by the one or more devices. The thermal management assembly includes an electrohydrodynamic (EHD) fluid accelerator including emitter and collector electrodes energizable to motivate fluid flow along the flow path.

In some implementations, the one or more devices includes one of a computing device, projector, copy machine, fax machine, printer, radio, audio or video recording device, audio or video playback device, communications device, charging device, power inverter, light source, medical device, home appliance, power tool, toy, game console, television, and video display device.

Advantages of use of an EHD device for thermal management in such devices includes, e.g., substantially silent operation, reduced power consumption, reduced vibration, reduced thermal solution footprint and volume, and form factor flexibility, e.g., capability to utilize space around other electronics.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Some implementations of thermal management systems described herein employ EHD devices to motivate flow of a fluid, typically air, based on acceleration of ions generated as a result of corona discharge. Other implementations may employ other ion generation and motivation techniques and will nonetheless be understood in the descriptive context provided herein. For example, in some implementations, techniques such as silent discharge, AC discharge, dielectric barrier discharge (DBD) or the like may be used to generate ions that are in turn accelerated in the presence of electrical fields to motivate fluid flow.

Typically, when a thermal management system is integrated into an operational environment, heat transfer paths (often implemented as heat pipes or using other technologies) are provided to transfer heat from where it is generated or dissipated to a location(s) within an enclosure where air flow motivated by an EHD device(s) flows over primary heat transfer surfaces. For example, heat generated by various system electronics (e.g., microprocessors, graphics units, etc.) and/or other system components (e.g., light sources, power units, etc.) can be transferred via a heat pipe to radiator fins and then to a cooling fluid and exhausted from the enclosure. Of course, while some implementations may be fully integrated in an operational system such as a laptop or desktop computer, a projector or video display device, printer, photocopier, etc., other implementations may take the form of subassemblies.

Figure 2:
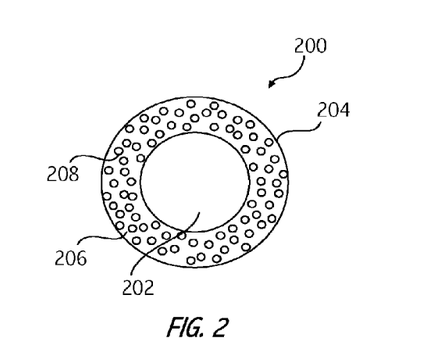
FIG. 2 depicts a cross-sectional view of an electrode including an electrode core and a solid solution layer about the core including a solvent metal and a solute material.

With reference to FIG. 2, an electrode 200 includes an electrode core 202 and a solid solution layer 204 about core 202. Solid solution layer 204 includes a solvent metal 206 and a solute material 208. In some implementations, electrode core 202 and solvent metal 206 can include at least one of, e.g., tungsten, titanium, tantalum, palladium, molybdenum, titanium nitride, copper and iron. In some implementations, solute electrode material 208 can include at least one of silver, nickel, gold, carbon, hydrogen, silicon and germanium.

Electrode 200 can be an emitter, collector or other electrode component of an EHD device. In some implementations, an emitter electrode 200 includes a surface, e.g., solid solution layer 204, comprising a solvent metal 206 and a solute material 208 selected to provide two substantially independent performance characteristics to the electrode surface. One or more collector electrodes can be positioned in spaced relation to emitter electrode 200 with the electrodes being energizable to motivate fluid flow along a flow path. The solute material 208 causes electrode 200 to exhibit one or more of ozone reactivity, resistance to oxidation, resistance to corona erosion, resistance to high temperature, resistance to thermal cycling, low coefficient of friction, and low surface adhesion.

In some implementations, the solute material 208 may be selected to have an ozone reduction function, e.g., to catalyze or otherwise reduce ozone generated by the device. As an illustrative example, a material that includes silver (Ag) may be used to reduce ozone in an air flow. Silver may also be used to prevent silica growth. In some embodiments, solute material 208 can include at least one of silver (Ag), silver oxide (Ag2O), manganese dioxide (MnO2), oxides of copper (CuO), palladium, cobalt, iron and carbon or other ozone reactive materials.

As used herein, the terms "ozone reducing material" refers to any material useful to catalyze, bind, sequester or otherwise reduce ozone. Ozone reducing materials can include ozone catalysts, ozone catalyst binders, ozone reactants or other materials suitable to react with, bind to, or otherwise reduce or sequester ozone. Ozone reducing materials can be selected to also target other undesirable airborne materials and pollutants.

In some implementations of electrode 200, solid solution layer 204 is formed via one of electroplating, anodizing, sputter deposition, dip coating and vapor deposited onto electrode core 202. In some instances, the solid solution layer 204 forms a substantially pore-free coating over electrode core 202. In some instances, solid solution layer 204 forms a discontinuous or varying layer over electrode core 202. Such a solid solution layer 204 need not be uniform or continuous over the entirety of core 202 or of operating surface of electrode 200.

In some implementations, the solute material 208 is deposited on the underlying solvent metal 206 and is then heat treated to form the solid solution layer 204. For example, a material that includes silver (Ag) is deposited over a palladium electrode core 202. The silver material and core 202 are then heat treated to infuse the silver into the surface of the palladium electrode core 202 to produce a solid solution layer 204 that reduces ozone production and can also prevent silica growth.

For example, in some implementations, the solid solution layer 204 may provide low adhesion or a "non stick" surface, or may exhibit a surface property that repels silica, which is a common material in dendrite formation. As an illustrative example, the solute material 208 may include carbon such as graphite, and may have low adhesion to dendrite formation and other detrimental material, and may improve the ease of mechanically removing such detrimental material.

Electrode performance characteristics may also be enhanced or provided by treating the surface or solid solution layer 204 of electrode 200. The terms "surface conditioning" and "conditioning materials" may be used to refer to any surface coating, surface deposit, surface alteration or other surface treatment suitable to provide ozone reduction, low surface adhesion, or other surface-specific performance or benefits described herein. For example, in some implementations, ozone reducing materials may be provided on various components in the form of "surface conditioning" on certain surfaces, e.g., on radiator surfaces, collector electrode surfaces, or other component surfaces.

Figure 3:
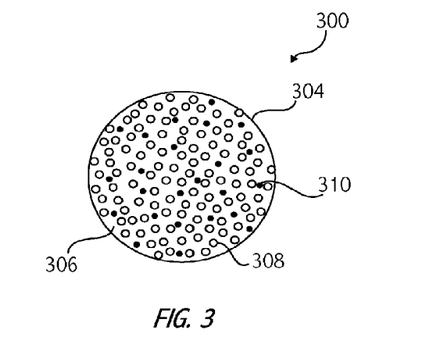
FIG. 3 depicts a cross-sectional view of an electrode having a substantial portion thereof formed of a solid solution of a solvent metal and a solute material.

With reference to FIG. 3, an electrode 300 is formed, at least through a substantial portion thereof, of a solid solution 304 including a solvent metal 306 and one or more solute material(s) 308/310. In some implementations, the solid solution 304 is of a substantially consistent composition throughout a thickness of the electrode 300. In some implementations, the solute materials 308/310 are concentrated substantially at an exterior portion, e.g., at the surface, of the electrode 300. In some implementations, the solute materials 308/310 include at least one of titanium nitride, chromium carbide and silica. In some implementations, the solute materials 308/310 include at least one of a metal, semi-metal, non-metal and a compound. Thus, one or multiple solute materials may be selected to provide desired performance characteristics in addition to those characteristics of the solvent metal 306.

In some implementations, the solvent metal 306 provides at least a first performance characteristic, e.g., moderate tensile strength and moderate hardness. The solute materials 308/310 provide at least a second performance characteristic, e.g., ozone reduction, low surface adhesion, low coefficient of friction, resistance to one of oxidation and corona erosion.

Electrode 300 may be formed substantially entirely of solid solution 304. Alternatively, solid solution 304 may comprise only a portion of the thickness of electrode 300. Thus, while electrode 300 is depicted as having the solid solution 304 extending substantially throughout the extent of electrode 300, solid solution 304 may be more concentrated or even limited to an outer portion of electrode 300 depending on the method of formation. For example, solid solution 304 may be formed on a preexisting electrode substrate via any number of plating, deposition, or other surface treatments.

While electrodes 200 and 300 are depicted as being substantially circular, any number of profiles may be used in electrode structures. For example, electrodes 200 and 300 may take the form of a plate, wire, rod, array, needle, cone, or the like and benefit from solid solution combined performance characteristics.

Figure 4:
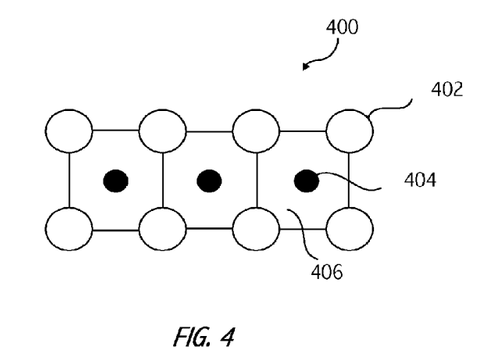
FIG. 4 depicts an interstitial solid solution matrix structure.

With reference to FIG. 4, an interstitial solid solution structure 400 includes a matrix of molecules of a solvent metal 402 and molecules of a solute material 404 in the interstices 406 of the matrix. A wide range of solute materials may be infused into the matrix of the solvent metal 402. For example, multiple solute materials 404 may be infused into the matrix of the solvent metal 402. Some examples of interstitial solid solutions include: carbon in iron, and hydrogen in palladium.

Such infusion can be accomplished, for example, by mixing the solvent metal 402 and solute material 404 in molten form. Alternatively, the solute material 404 may be infused into the surface of a solid solvent metal 402 via any suitable deposition method and heat treatment or other suitable infusion method. Other methods include sol gel, vapor phase deposition and wet plating.

In some cases, a solute material may cause internal stresses in the matrix of the solvent metal 402. It has been discovered that infusion of a multiple solute materials 404 of differing molecule size or properties can serve to at least partially mitigate such stresses and reduce the degree of resultant surface micro-cracking. For example, a first solute material of manganese (atomic radius 127 pm) in palladium (atomic radius 137 pm) at 5 atomic percent solution may result in significant micro-cracking. It has been discovered that infusion of a second solute material of silver (atomic radius 144 pm) can serve to mitigate the internal matrix stresses and resultant surface micro-cracking. It is believed that the second solute material, which is a smaller molecule than that of the first solute material, allows for localized relief of lattice or matrix stresses due to the tight fit of the first solute material within the interstices of the matrix. Similarly, the second solute material may serve to further disperse the first solute material throughout the matrix, further reducing localized stress. Of course, the interstitial solute material 404 need not be uniformly dispersed within the solvent metal 402, but may be concentrated in discrete areas or within a particular thickness or other region.

Figure 5:
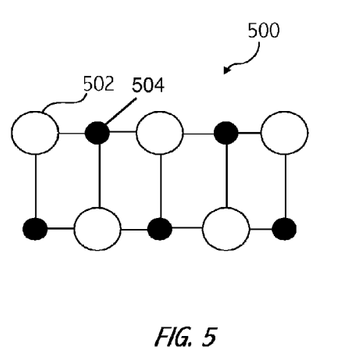
FIG. 5 depicts a substitutional solid solution matrix structure.

With reference to FIG. 5, a substitutional solid solution structure 500 includes solvent metal molecules 502 and solute material molecules 504 in a matrix in which the solute material molecules 504 have displaced solvent metal molecules 502. Some examples of substitutional solid solutions include: silver in palladium, and manganese in palladium, and copper in nickel.

In some substitutional solid solution implementations, it may be desirable to select solvent metal 502 and solute material 504 and their relative concentrations so as to mitigate localized stresses in the solid solution matrix. Such stresses could otherwise lead to micro-cracking, which can, in turn, lead to erosion of the electrode, particularly of more susceptible core materials, and ultimately to premature electrode performance deterioration or electrode failure.

With reference again to FIG. 1, emitter electrode 10 may be energizable to generate ions and may be positioned relative to collector electrode(s) 12 to motivate fluid flow along a fluid flow path. Thus, emitter electrode 10 and collector electrode(s) 12 may at least partially define an EHD fluid accelerator. Any number of additional electrodes may be positioned upstream and downstream of the EHD fluid accelerator along the fluid flow path. For example, in some implementations, a collector electrode can be disposed upstream of the EHD fluid accelerator along the fluid flow path and can operate as an electrostatic precipitator.

Figure 6:
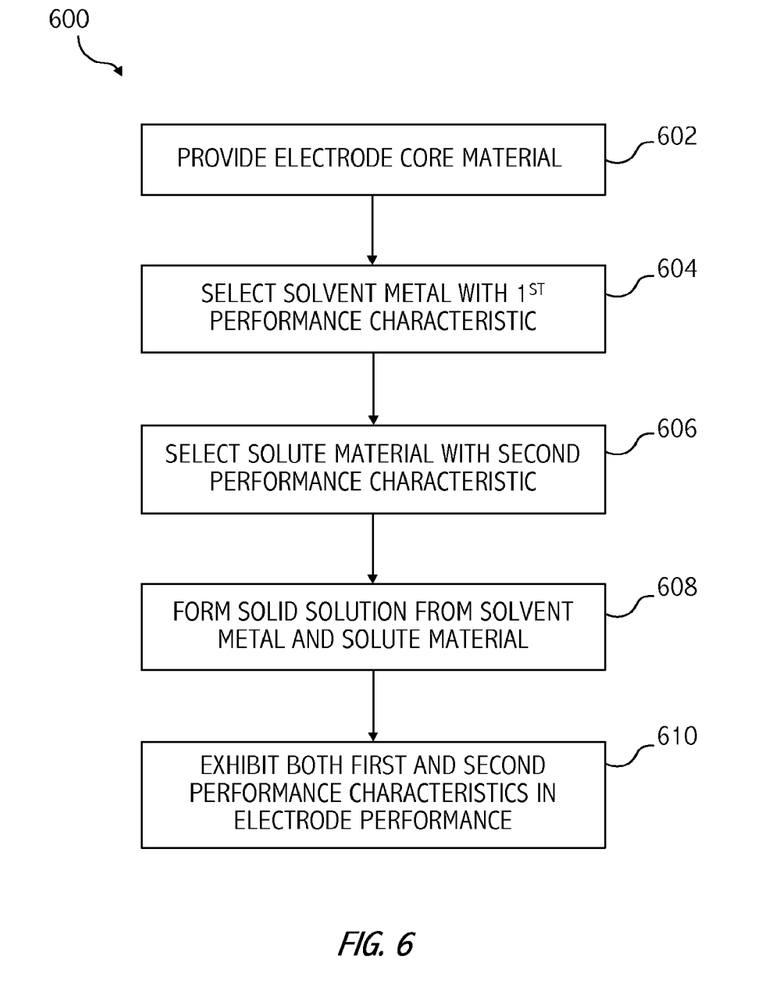
FIG. 6 depicts a block diagram of a method of providing an electrode with independent performance characteristics of respective solid solution components.

With reference to FIG. 6, in some applications, a method 600 of making a product includes providing an electrode core material. (block 602). The method further includes selecting a solvent metal with a first performance characteristic. (block 604). At least a first solute material is also selected with a second performance characteristic. (block 606). A solid solution is then formed about the electrode core from the solvent metal and the solute material(s). (block 608). Each of the solvent metal and the solute material remain substantially pure at the atomic level within the solid solution and thus impart the respective independent first and second performance characteristics to the electrode. (610)

The solid solution can be first formed and then deposited on the electrode core. Alternatively, in some implementations, the electrode core material comprises the solvent metal, and the solid solution is provided at least at the surface of the electrode core material. For example, the solid solution can be formed on the electrode core, e.g., with the solute material infusing into the electrode core as the solvent metal. In some cases, a substantial portion of the electrode itself can be formed from a solid solution.

For example, providing the solid solution on the electrode core material can comprise providing, separately, the solute material and the solvent metal over a core and heat treating the solute material and solvent metal to induce formation of the solid solution. In some applications, the solid solution is provided on the electrode core material via at least one of electroplating, vapor deposition, and sputter deposition. In some implementations, the solid solution is provided substantially at the surface of the electrode core material. In some implementations, the solid solution extends, at least partially, into the electrode core material.

In implementations in which the electrode core is the solvent metal, the solid solution can extend substantially throughout the electrode core material. Example solvent metals include, e.g., at least one of tungsten, titanium, tantalum, palladium, molybdenum, and titanium nitride. Example solute material(s) include, e.g., at least one of silver, nickel, gold, carbon, hydrogen, silicon, germanium, titanium nitride, chromium carbide, and silica.

In some applications, an EHD product is made by a method that includes positioning an emitter or collector electrode comprising a solid solution and at least one other electrode to motivate fluid flow along a flow path when the electrodes are energized. One or both of the emitter and collector electrodes, or another electrode includes a surface comprising a solid solution comprising a solvent metal and a solute material selected to provide two substantially independent performance characteristics to the respective electrode surface.

In some applications, the method further includes positioning heat transfer surfaces in the flow path to transfer heat to the fluid flow. The emitter electrode, collector electrode and primary heat transfer surfaces are so positioned and fixed to constitute a thermal management assembly.

In some applications, the method includes introducing the thermal management assembly into an electronic device and thermally coupling a heat generating or dissipating device thereof to the primary heat transfer surfaces. In some cases, the electronic device includes at least one of a computing device, projector, copy machine, fax machine, printer, radio, audio or video recording device, audio or video playback device, communications device, charging device, power inverter, light source, medical device, home appliance, power tool, toy, game console, television, and video display device.

In some implementations, an EHD fluid accelerator includes an emitter electrode and a collector electrode(s) energizable to generate ions and to thereby motivate fluid flow along a flow path. Primary heat transfer surfaces (collectively referred to sometimes as a "radiator") are positioned downstream of the emitter electrode along the flow path. The radiator is coupled into a heat transfer pathway to dissipate heat from a device into the fluid flow.

In some implementations, the radiator is distinct from the collector electrode, but proximate thereto in the flow path. In some cases, the radiator is positioned immediately downstream of the collector electrode. In some cases, the radiator abuts the collector electrode. In some cases, the radiator is spaced a distance apart from the collector electrode. Still, in some implementations, the downstream radiator and the collector electrode are constituent surfaces of a unitary structure that functions both as the collector electrode and as a radiator. In some cases, the downstream radiator and the collector are separately formed, but joined to form the unitary structure. In some cases, the radiator and collector are integrally formed.

In some implementations, a monolithic structure may act as a collector electrode and a heat transfer radiator. The solid solution materials may be selected to provide both desirable performance characteristics for both electrode and radiator functions. In some implementations, the collector electrodes and radiator are provided (or at least fabricated) as separate structures that may be mated, integrated or more generally positioned proximate to each other in operational configurations. These and other variations will be understood with reference to the described implementations.

Some implementations of thermal management systems described herein employ EFA or EHD devices to motivate flow of a fluid, typically air, based on acceleration of ions generated as a result of corona discharge. Other implementations may employ other ion generation techniques and will nonetheless be understood in the descriptive context provided herein. Using heat transfer surfaces that may or may not be monolithic or integrated with collector electrodes, heat dissipated by electronics (e.g., microprocessors, graphics units, etc.) and/or other components can be transferred to the fluid flow and exhausted. Typically, when a thermal management system is integrated into an operational environment, heat transfer paths e.g., heat pipes, are provided to transfer heat from where it is dissipated or generated to a location(s) within the enclosure where air flow motivated by an EFA or EHD device(s) flows over heat transfer surfaces.

In general, a variety of scales, geometries, positional interrelationships and other design variations are envisioned for emitter and collector electrodes of a given device. For concreteness of description, certain illustrative implementations, surface profiles and positional interrelationships with other components are described herein. In some implementations, the emitter electrode is an elongated wire and the collector electrode includes two elongated plates substantially parallel to the emitter electrode. Of course, the emitter and collector electrodes may be selected and arranged in any manner suitable to generate ions and thereby motivate fluid flow. For example, planar portions of the collector electrodes may be oriented generally orthogonally to the longitudinal extent of an emitter electrode wire. Any references to leading, trailing, upstream, or downstream are to be understood with directional reference to EHD fluid flow.

In some thermal management system implementations, collector electrodes can provide significant heat transfer to fluid flows motivated therethrough or thereover. In some cases, the collector electrodes can also serve as a primary heat transfer surface. In some thermal management implementations, the primary heat transfer surfaces do not participate substantially in EHD fluid acceleration, i.e., they do not serve as electrodes.

It will be understood that particular EHD design variations are included for purposes of illustration and, persons of ordinary skill in the art will appreciate a broad range of design variations consistent with the description herein. Although implementations of the present invention are not limited thereto, portions of the description herein are consistent with geometries, air flows, and heat transfer paths typical of laptop-type computer electronics and will be understood in view of that descriptive context. Of course, the described implementations are merely illustrative and, notwithstanding the particular context in which any particular implementation is introduced, persons of ordinary skill in the art having benefit of the present description will appreciate a wide range of design variations and exploitations for the developed techniques and configurations. Indeed, EHD device technologies present significant opportunities for adapting structures, geometries, scale, flow paths, controls and placement to meet thermal management challenges in a wide range of applications, systems and devices of various form factors. Moreover, reference to particular materials, dimensions, packaging or form factors, thermal conditions, loads or heat transfer conditions and/or system designs or applications is merely illustrative.

Figure 7:
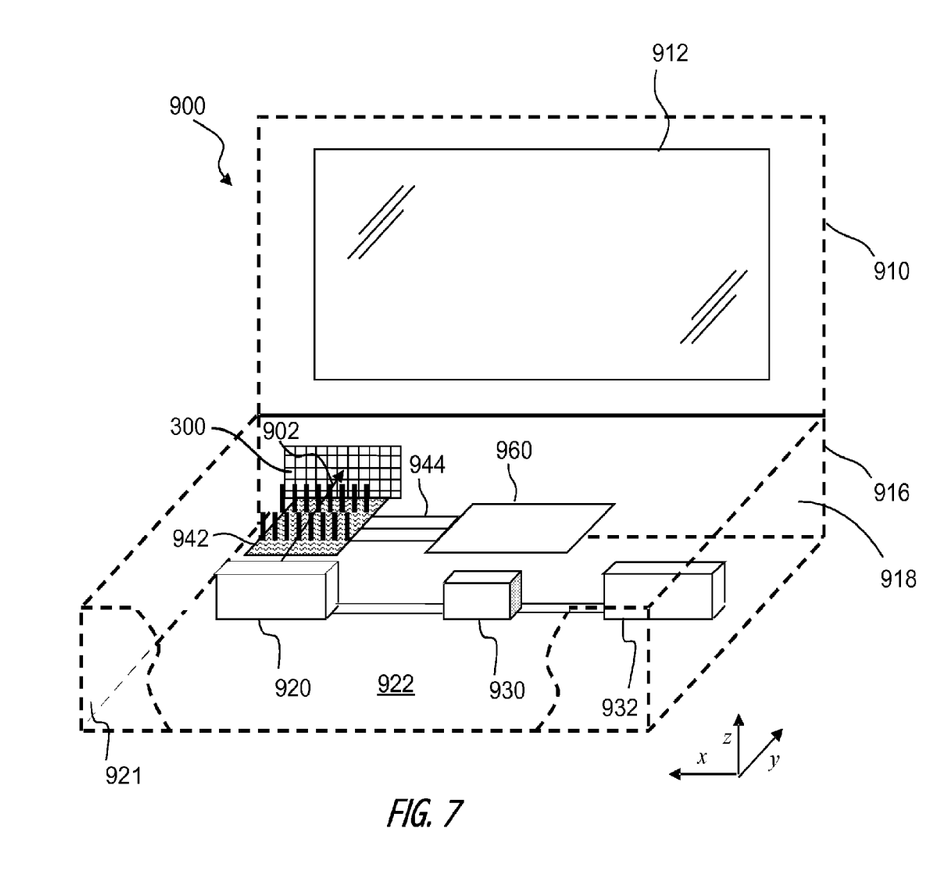
FIG. 7 depicts a schematic block diagram illustrating one implementation of an environment in which a solid solution electrode may operate.

FIG. 7 is a schematic block diagram illustrating one implementation of an environment in which a solid solution electrode may operate. An electronic device 900, such as a computer, includes an EFA or EHD air cooling system 920. Electronic device 900 comprises a housing 916, or case, having a cover 910 that includes a display device 912. A portion of the front surface 921 of housing 916 has been cut away to reveal interior 922. Housing 916 of electronic device 900 may also comprise a top surface (not shown) that supports one or more input devices that may include, for example, a keyboard, touchpad and tracking device. Electronic device 900 further comprises electronic circuit 960 which generates heat in operation. A thermal management solution comprises a heat pipe 944 that draws heat from electronic circuit 960 to heat sink device 942.

Device 920 is powered by high voltage power supply 930 and is positioned proximate to heat sink 942. Electronic device 900 may also comprise many other circuits, depending on its intended use; to simplify illustration of this second implementation. Other components that may occupy interior area 922 of housing 920 have been omitted from FIG. 7.

With continued reference to FIG. 7, in operation, high voltage power supply 930 is operated to create a voltage difference between emitter electrodes and collector electrodes disposed in device 920, generating an ion flow or stream that moves ambient air toward the collector electrodes. The moving air leaves device 920 in the direction of arrow 902, traveling through the protrusions of heat sink 942 and through an exhaust grill or opening 970 in the rear surface 918 of housing 916, thereby dissipating heat accumulating in the air above and around heat sink 942. Note that the position of illustrated components, e.g., of power supply 930 relative to device 920 and electronic circuit 960, may vary from that shown in FIG. 7.

Note that electronic device 900 has been greatly simplified for purposes of illustration and the position of illustrated components, e.g., of power supply 930 relative to device 920 and electronic circuit 960, may vary from that shown in FIG. 7. While device 900 is depicted as a laptop computing device, tablet devices, and handheld devices may likewise benefit from EHD cooling and ozone reduction as described.

A controller 932 is connected to device 920 and may use sensor inputs to determine the state of the air cooling system, e.g., to determine a need for cleaning electrodes on a timed or scheduled basis, on a system efficiency measurement basis or by other suitable methods of determining when to clean electrodes. For example, detection of electrode arcing or other electrode performance characteristics may be used to initiate movement of a cleaning device or electrode conditioning device. Electrode performance may be determined, for example, by monitoring voltage levels, current levels, acoustic levels, electrical potentials, determining of the presence of a level of contamination by optical means, detecting an event or performance parameter, or other methods indicating a benefit from mechanically cleaning or conditioning the electrode.

Figure 8:
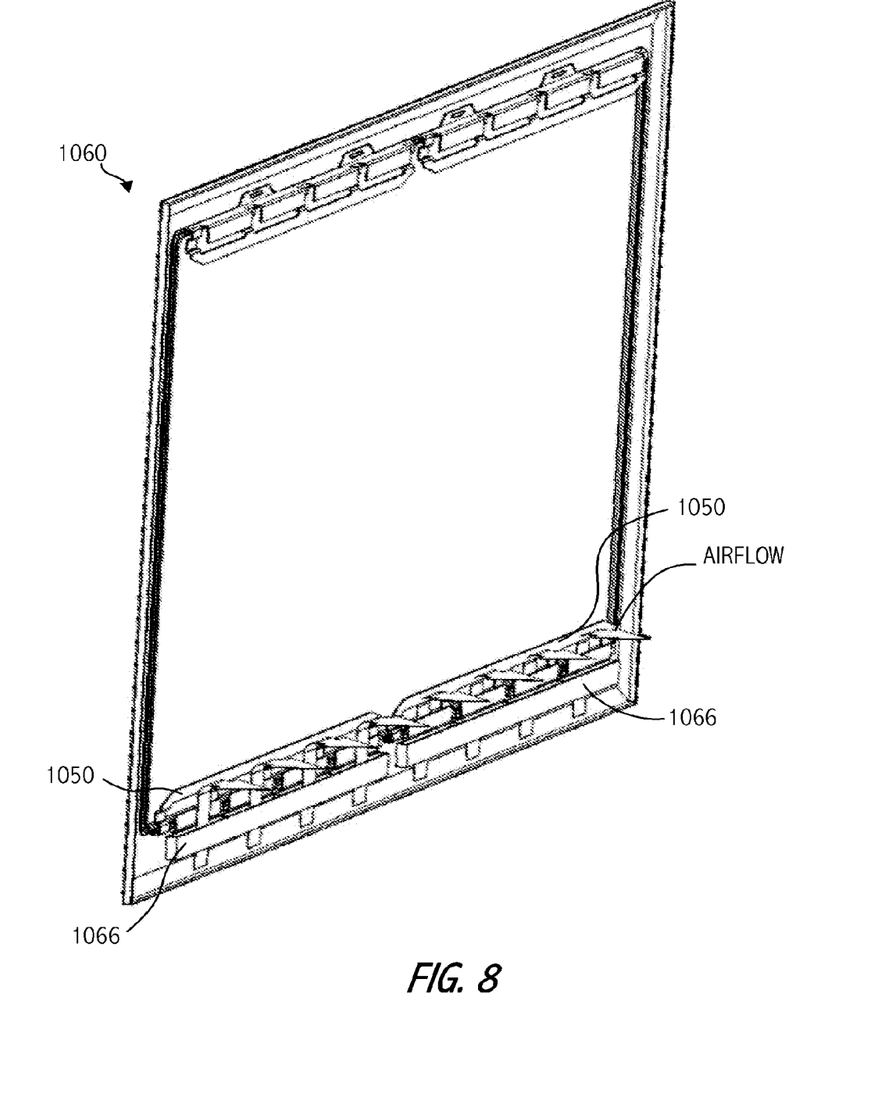
FIG. 8 is a rear view of a display device illustrating an EHD device in which a solid solution electrode may operate to motivate airflow along a localized flow path.

With reference to FIG. 8, in some implementations, one or more EHD air movers 1066 including a solid solution electrode may be positioned along an edge of a display device 1060, e.g., television or monitor, to provide air flow to dissipate heat generated by a light source 1050 of the display device 1060. The air flow can travel a flow path extending across a major dimension of the display device or can travel a more localized path. Heat transfer and dissipation can be aided by heat spreaders, heat pipes, or other thermal spreaders/paths. In this example, EHD air movers 1066 motivate air flow over a relatively short flow path across heat transfer surfaces associated with light sources 1060. The inlets and outlets of the flow path can be defined in any suitable combination of display housing surfaces, e.g., front bezel portions, top or bottom surfaces, lateral surfaces or rearward facing portions of the display device 1060.

Figure 9A:
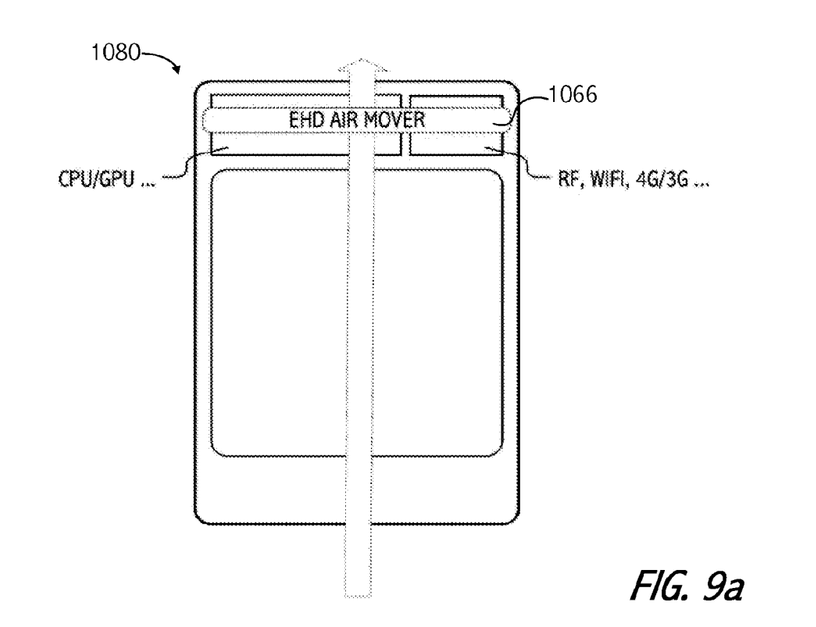
FIGS. 9*a-b* depict top views of tablet or handheld computing devices including an EHD in which a solid solution electrode may operate to motivate airflow.
Figure 9B:
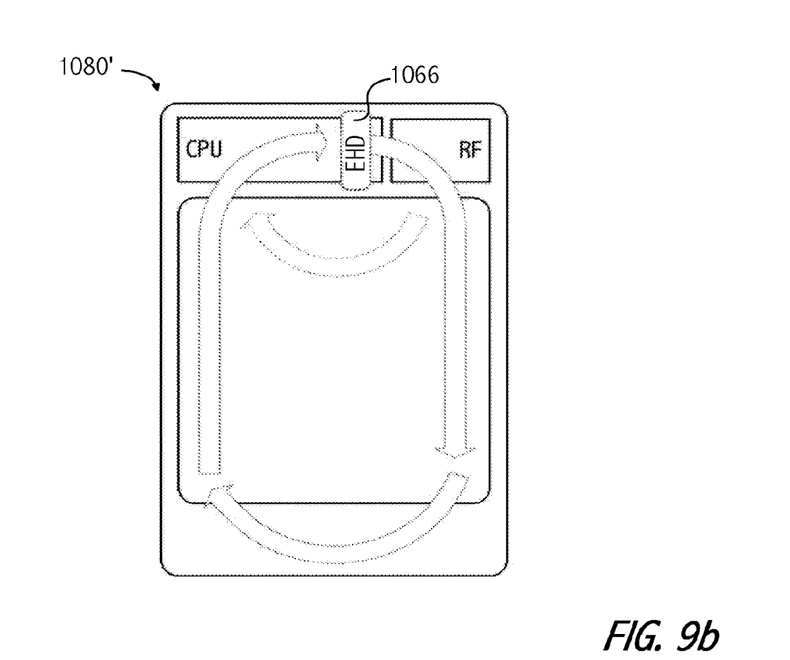

With reference to FIG. 9a-b, in some implementations, one or more EHD air movers 1066 including a solid solution electrode are constructed and arranged to motivate air flow (indicated by broad arrows) through or within a tablet or handheld computing device 1080, 1080'. For example, air flow may be drawn into and exhausted from device 1080 as in FIG. 9a, passing, e.g., over a battery, CPU, display light source, or associated heat transfer surfaces. Alternatively, the air flow may circulate within a substantially sealed portion of an enclosure of device 1080' to better distribute heat for radiative heat transfer from the enclosure to the environment. In some implementations, device 1080 has a total thickness of less than about 10 mm and a display surface covers substantially an entire major surface thereof. Any air flow topology and EHD air mover placement may be suitably selected relative to respective electronic assemblies (or circuit boards) for processors (e.g., CPU, GPU, etc.) and/or radio frequency (RF) sections (e.g., WiFi, WiMax, 3G/4G voice/data, GPS, etc.).

In some implementations, an EFA or EHD air cooling system or other similar ion action device employing an electrode cleaning system may be integrated in an operational system such as a laptop or desktop computer, a projector or video display device, etc., while other implementations may take the form of subassemblies. Various features may be used with different devices including EFA or EHD devices such as air movers, film separators, film treatment devices, air particulate cleaners, photocopy machines and cooling systems for electronic devices such as computers, laptops and handheld devices. One or more devices includes one of a computing device, projector, copy machine, fax machine, printer, radio, audio or video recording device, audio or video playback device, communications device, charging device, power inverter, light source, medical device, home appliance, power tool, toy, game console, television, and video display device.

While the foregoing represents a description of various implementations of the invention, it is to be understood that the claims below recite the features of the present invention, and that other implementations, not specifically described hereinabove, fall within the scope of the present invention.

What is claimed is:

1. An electrode for use in an electrohydrodynamic device, the electrode comprising:
    an elongated electrode body including an electrode solvent metal selected to exhibit first performance characteristics including electrical conductivity and at least moderate hardness and tensile strength such that the electrode can be tensioned and energized with a high voltage; and
    at least one solute material forming a solid solution with the solvent metal substantially without forming intermetallic compounds with the solvent metal, the solute material selected to exhibit second performance characteristics substantially independent of the first performance characteristics of the solvent metal.

2. The electrode of claim 1, wherein the electrode solvent metal includes at least one of tungsten, titanium, tantalum, palladium, molybdenum, titanium, copper and iron.

3. The electrode of claim 1, wherein the at least one solute material includes one of a metal, semi-metal, non-metal and a compound.

4. The electrode of claim 3, wherein the at least one solute material includes at least one of silver, nickel, gold, carbon, hydrogen, silicon, manganese and germanium.

5. The electrode of claim 3, wherein the at least one solute material includes at least one of titanium nitride, chromium carbide and silica.

6. The electrode of claim 3, further comprising a second solute material in solid solution in the electrode solvent metal.

7. The electrode of claim 1, wherein a crystal structure of the solvent metal remains substantially unchanged by addition of the solute material and wherein the solid solution comprises a substantially homogeneous phase.

8. The electrode of claim 1, wherein the second performance characteristics includes ozone reduction.

9. The electrode of claim 8, wherein the at least one solute material includes an ozone catalyst.

10. The electrode of claim 1, wherein the second performance characteristics includes at least one of low surface adhesion, low coefficient of friction, resistance to oxidation, resistance to high temperature, resistance to thermal cycling and resistance to corona erosion.

11. The electrode of claim 1, wherein the solid solution is one of a substitutional solid solution and an interstitial solid solution.

12. The electrode of claim 1, wherein the solid solution is a homogenous phase of substantially consistent composition throughout a thickness of the electrode.

13. The electrode of claim 1, wherein the at least one solute material is concentrated substantially on an exterior surface of the electrode.

14. The electrode of claim 1, further comprising an electrode core about which the solid solution is formed.

15. The electrode of claim 14, wherein the at least one solute material forms a solid solution layer on the surface of the electrode core formed of the solvent metal.

16. The electrode of claim 14, wherein the solid solution is one of electroplated, sputter deposited and vapor deposited onto the electrode core.

17. The electrode of claim 14, wherein the solid solution forms a substantially uniform coating over the electrode core.

18. A method of forming an electrode for use in an electrohydrodynamic device, the method comprising:
    providing an elongated electrode core selected to provide sufficient electrode dimensional stability and electrical conductivity for the electrode to be tensioned and energized with a high voltage;
    providing on the electrode core a solvent metal selected to exhibit first performance characteristics including electrical conductivity and at least moderate hardness; and
    providing at least one solute material forming a solid solution with the solvent metal substantially without forming intermetallic compounds with the solvent metal, the solute material selected to exhibit second performance characteristics substantially independent of the first performance characteristics of the solvent metal.

19. The method of claim 18, wherein providing the solvent metal and solute material on the electrode core includes coating the solid solution onto the electrode core.

20. The method of claim 18, comprising heat treating the solute material and solvent metal to induce formation of the solid solution.

21. The method of claim 18, wherein at least one of the solvent metal and the solute metal is provided on the electrode core via at least one of electroplating, vapor deposition, and sputter deposition.

22. The method of claim 18, wherein the solvent metal comprises an outward portion of the electrode core such that the solid solution is formed at least at the surface of the electrode core.

23. The method of claim 22, wherein the solid solution extends substantially throughout the electrode core.

24. An electrohydrodynamic device comprising:
 an emitter electrode; and
 one or more collector electrodes in spaced relation to the emitter electrode; the emitter and one or more collector electrodes being energizable to motivate fluid flow along a flow path;
 wherein at least one of the collector and emitter electrodes comprises:
  an elongated electrode body including an electrode solvent metal selected to exhibit electrical conductivity and at least moderate hardness and tensile strength; and
  at least one solute material forming a solid solution with the solvent metal substantially without forming intermetallic compounds with the solvent metal, the solute material selected to exhibit one or more of ozone reactivity, resistance to oxidation, resistance to corona erosion, low coefficient of friction, and low surface adhesion.

25. The method of claim 24, further comprising providing a second solute material in solid solution in the solvent metal to provide a third independent performance characteristic.

26. An apparatus comprising:
 an enclosure; and
 a thermal management assembly for use in convection cooling of one or more devices within the enclosure, the thermal management assembly defining a flow path for conveyance of air between portions of the enclosure over heat transfer surfaces positioned along the flow path to dissipate heat generated by the one or more devices, the thermal management assembly including an electrohydrodynamic (EHD) fluid accelerator comprising:
  collector and emitter electrodes in spaced relation and energizable to motivate fluid flow along the flow path;
  wherein at least one of the collector and emitter electrodes comprises:
   an elongated electrode body including an electrode solvent metal selected to exhibit electrical conductivity and at least moderate hardness and tensile strength; and
   at least one solute material forming a solid solution with the solvent metal substantially without forming intermetallic compounds with the solvent metal, the solute material selected to exhibit one or more of ozone reactivity, resistance to oxidation, resistance to corona erosion, low coefficient of friction, and low surface adhesion.

27. The apparatus of claim 26, wherein the one or more devices includes one of a computing device, projector, copy machine, fax machine, printer, radio, audio or video recording device, audio or video playback device, communications device, charging device, power inverter, light source, medical device, home appliance, power tool, toy, game console, television, and video display device.

* * * * *